United States Patent
Tsubata

(10) Patent No.: US 11,947,363 B2
(45) Date of Patent: Apr. 2, 2024

(54) AIRCRAFT AND FLIGHT CONTROLLER FOR AIRCRAFT

(71) Applicant: SUBARU CORPORATION, Tokyo (JP)

(72) Inventor: Hiroyuki Tsubata, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 408 days.

(21) Appl. No.: 17/091,683

(22) Filed: Nov. 6, 2020

(65) Prior Publication Data

US 2021/0261246 A1  Aug. 26, 2021

(30) Foreign Application Priority Data

Feb. 26, 2020 (JP) .................... 2020-029962

(51) Int. Cl.
| | |
|---|---|
| G05D 1/08 | (2006.01) |
| B64C 13/16 | (2006.01) |
| B64D 45/02 | (2006.01) |
| G01R 29/08 | (2006.01) |
| G05D 1/00 | (2006.01) |

(52) U.S. Cl.
CPC .......... G05D 1/0808 (2013.01); B64C 13/16 (2013.01); B64D 45/02 (2013.01); G01R 29/0842 (2013.01)

(58) Field of Classification Search
None
See application file for complete search history.

(56) References Cited

U.S. PATENT DOCUMENTS

| | | |
|---|---|---|
| 6,507,739 B1 | 1/2003 | Gross et al. |
| 8,723,694 B1 | 5/2014 | Finley et al. |
| 10,255,818 B2 * | 4/2019 | Oldach ............... G08G 5/0091 |

(Continued)

FOREIGN PATENT DOCUMENTS

| | | |
|---|---|---|
| CN | 204423158 U | 6/2015 |
| CN | 107608386 A | 1/2018 |

(Continued)

OTHER PUBLICATIONS

Extended European Search Report issued in corresponding European Patent Application No. 21151111.8-1010, dated Jun. 11, 2021.

(Continued)

*Primary Examiner* — Fadey S. Jabr
*Assistant Examiner* — Mario C Gonzalez
(74) *Attorney, Agent, or Firm* — Rimon P.C.

(57) ABSTRACT

An aircraft includes a fuselage, a main wing, and a flight controller. The main wing is attached to the fuselage and configured to generate lift that acts on the aircraft. The flight controller includes an electric field direction estimator, an attitude calculator, and an attitude controller. The electric field direction estimator is configured to estimate a direction of an electric field around the aircraft. The attitude calculator is configured to calculate a target airframe attitude that reduces a possibility of occurrence of lightning strike on the aircraft, on the basis of the direction of the electric field estimated by the electric field direction estimator. The attitude controller is configured to control an attitude of an airframe of the aircraft to cause the attitude of the airframe to be the target airframe attitude calculated by the attitude calculator.

11 Claims, 7 Drawing Sheets

(56) References Cited

U.S. PATENT DOCUMENTS

| | | |
|---|---|---|
| 10,450,086 B2 | 10/2019 | Martinez-Sanchez et al. |
| 2017/0200311 A1* | 7/2017 | Pilskalns ................ G06T 17/05 |
| 2017/0313438 A1* | 11/2017 | Martinez-Sanchez ...................... B64D 45/02 |
| 2018/0246528 A1* | 8/2018 | van Cruyningen .... B64D 45/00 |

FOREIGN PATENT DOCUMENTS

| | | | |
|---|---|---|---|
| CN | 108469838 A | * 8/2018 | ........... G01C 21/165 |
| CN | 109933090 A | 6/2019 | |
| JP | 04-071197 A | 3/1992 | |
| JP | H07-151866 A | 6/1995 | |

OTHER PUBLICATIONS

Office Action issued in corresponding Japanese Patent Application No. 2020-029962, dated Oct. 3, 2023, w/ English Translation.

* cited by examiner

| SENSOR (NOSE) | SENSOR (TAIL) | SENSOR (RIGHT WING) | SENSOR (LEFT WING) | PITCH ANGLE | ROLL ANGLE |
|---|---|---|---|---|---|
| ⋮ | ⋮ | ⋮ | ⋮ | ⋮ | ⋮ |
| A | B | C | D | E | F |
| ⋮ | ⋮ | ⋮ | ⋮ | ⋮ | ⋮ |

AIRCRAFT AND FLIGHT CONTROLLER FOR AIRCRAFT

CROSS-REFERENCE TO RELATED APPLICATIONS

The present application claims priority from Japanese Patent Application No. 2020-029962 filed on Feb. 26, 2020, the entire contents of which are hereby incorporated by reference.

BACKGROUND

The technology relates to an aircraft and a flight controller for the aircraft that control an attitude of an airframe of the aircraft during its flight.

A technique is known that prevents lightning strike by means of ion emission. For example, Japanese Unexamined Patent Application Publication No. H04-071197 discloses a lightning strike prevention apparatus that prevents direct strike of lightning on the ground by forming an ion cloud. The lightning strike prevention apparatus forms the ion cloud by generating corona discharge to attach ions to a mist and emitting the ions from the ground.

SUMMARY

An aspect of the technology provides an aircraft that includes a fuselage, a main wing, and a flight controller. The main wing is attached to the fuselage and configured to generate lift that acts on the aircraft. The flight controller includes an electric field direction estimator, an attitude calculator, and an attitude controller. The electric field direction estimator is configured to estimate a direction of an electric field around the aircraft. The attitude calculator is configured to calculate a target airframe attitude that reduces a possibility of occurrence of lightning strike on the aircraft, on the basis of the direction of the electric field estimated by the electric field direction estimator. The attitude controller is configured to control an attitude of an airframe of the aircraft to cause the attitude of the airframe to be the target airframe attitude calculated by the attitude calculator.

An aspect of the technology provides a flight controller for an aircraft. The flight controller includes an electric field direction estimator, an attitude calculator, and an attitude controller. The electric field direction estimator is configured to estimate a direction of an electric field around the aircraft. The attitude calculator is configured to calculate a target airframe attitude that reduces a possibility of occurrence of lightning strike on the aircraft, on the basis of the direction of the electric field estimated by the electric field direction estimator. The attitude controller is configured to control an attitude of an airframe of the aircraft to cause the attitude of the airframe to be the target airframe attitude calculated by the attitude calculator.

An aspect of the technology provides an aircraft that includes a fuselage, a main wing, and circuitry. The main wing is attached to the fuselage and configured to generate lift that acts on the aircraft. The circuitry is configured to estimate a direction of an electric field around the aircraft, calculate a target airframe attitude that reduces a possibility of occurrence of lightning strike on the aircraft, on the basis of the estimated direction of the electric field, and control an attitude of an airframe of the aircraft to cause the attitude of the airframe to be the calculated target airframe attitude.

An aspect of the technology provides a flight controller for an aircraft. The flight controller includes circuitry configured to estimate a direction of an electric field around the aircraft, calculate a target airframe attitude that reduces a possibility of occurrence of lightning strike on the aircraft, on the basis of the estimated direction of the electric field, and control an attitude of an airframe of the aircraft to cause the attitude of the airframe to be the calculated target airframe attitude.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
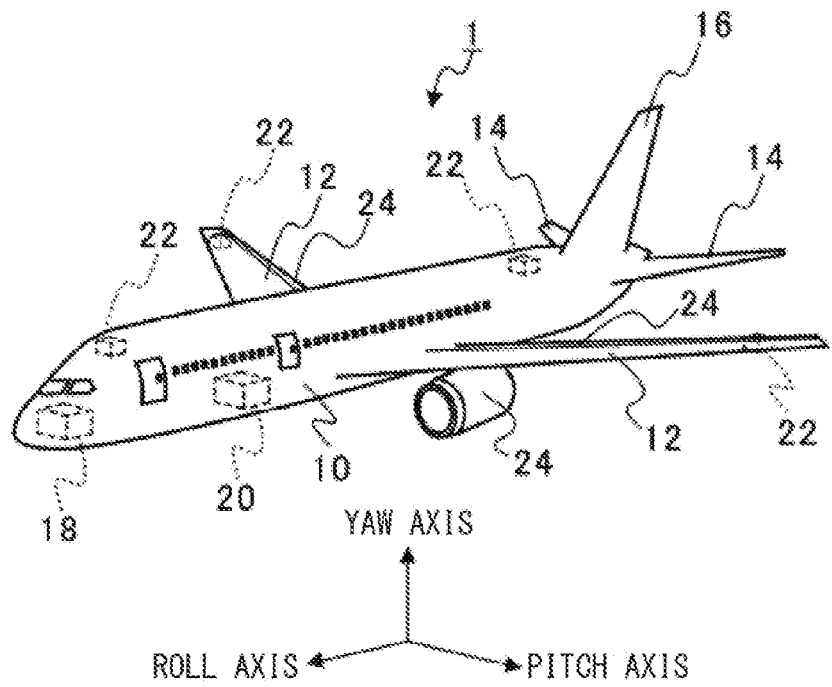
FIG. 1 is a schematic perspective view of an aircraft according to one example embodiment of the technology.

In the following, some embodiments of the technology are described in detail with reference to the accompanying drawings. Note that the following description is directed to illustrative examples of the disclosure and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the technology are unillustrated in the drawings.

FIG. 1 is a schematic perspective view of an aircraft 1 according to an example embodiment of the technology. Referring to FIG. 1, the aircraft 1 includes a fuselage 10, a main wing 12, and a flight controller 18. The aircraft 1 may also include a horizontal tail 14, a vertical tail 16, an attitude sensor 20, an electric field sensor 22, and a flight mechanism 24. Note that an example embodiment exemplifies a passenger airplane as the aircraft 1; however, any embodiment of the technology is applicable to any of various machines that fly in the air. It is to be also noted that an example embodiment exemplifies the aircraft adapted to automatically control an attitude of an airframe. However, any embodiment of the technology is also applicable to an aircraft adapted to prompt a pilot to fly the aircraft such that a target airframe attitude is attained, by presenting the target airframe attitude to the pilot by means of a device provided in a cockpit, such as a display. In one embodiment, the aircraft 1 may serve as an "aircraft". In one embodiment, the fuselage 10 may serve as a "fuselage". In one embodiment, the main wing 12 may serve as a "main wing". In one embodiment, the flight controller 18 may serve as a "flight controller".

The fuselage 10 may extend in a direction of a roll axis between a nose and a tail of the aircraft 1. The main wing 12, the horizontal tail 14, and the vertical tail 16 may be fixed to the fuselage 10 and contribute to a stable flight of the aircraft 1.

The flight controller 18 may be or may include a semiconductor integrated circuit. The semiconductor integrated circuit may have devices including a read-only memory (ROM) that holds programs, etc. and a random-access memory (RAM) that serves as a work area. The flight controller 18 may receive an input of operation performed by the pilot that flies the aircraft 1, and control the flight mechanism 24 to maintain the flight of the aircraft 1.

The attitude sensor 20 may be or may include an inertial measurement unit (IMU), for example. The attitude sensor 20 may detect the attitude of the airframe of the aircraft 1.

The multiple electric field sensors 22 may be provided at respective different positions on an outer surface positioned on an upper side of the aircraft 1. In some embodiments, four electric field sensors 22 may be provided at the nose, the tail, and ends of the main wing 12 as illustrated in FIG. 1. The electric field sensor 22 may detect an electric field intensity of a location at which the electric field sensor 22 is provided. In an example embodiment, the four electric field sensors 22 may be disposed on a surface of the airframe to detect the electric field intensity of a position at which the corresponding electric field sensor 22 is provided. Note, however, that the number of electric field sensors 22 and the number of positions at which the electric field intensities are to be detected do not necessarily have to be in a one-to-one relationship.

The flight mechanism 24 may include: fixed wings including the main wing 12, the horizontal tail 14, and the vertical tail 16; and an internal combustion engine that achieves thrust. The internal combustion engine may be a jet engine, a reciprocating engine, or any other type of engine. The flight mechanism 24 may keep a state in which the airframe is floated in the air by generating lift around the wings through the thrust. Note that a mechanism that generates the lift is not limited thereto. A rotatable rotary wing, or a rotor, may be used to achieve the lift and/or the thrust. The flight mechanism 24 may control a nose angle (a pitch angle) and/or a bank angle (a roll angle) by means of an elevator and/or an aileron. The flight mechanism 24 may also control the attitude of the airframe, a direction of flight (a yaw angle), an altitude, and a flight speed by adjusting, for example, an output of the internal combustion engine.

Figure 2:
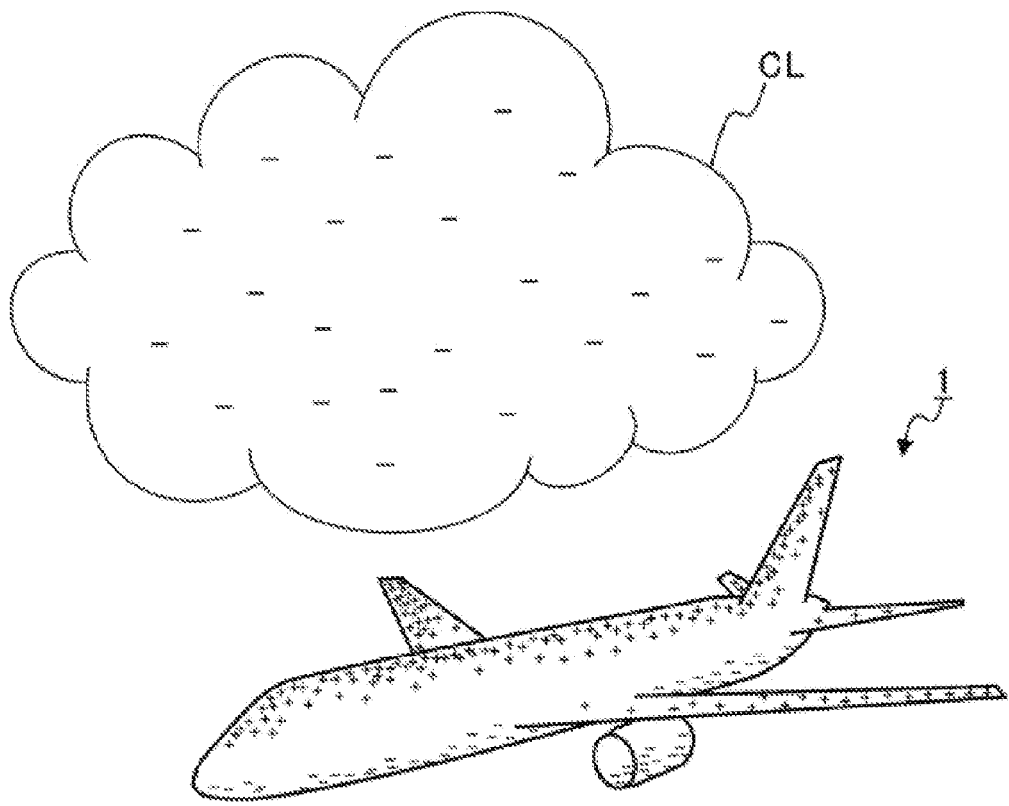
FIG. 2 is a diagram illustrating an example of polarization of electric charges in the aircraft.

FIG. 2 illustrates an example of polarization of electric charges in the aircraft 1. In FIG. 2, "+" and "−" respectively denote positive electric charges and negative electric charges. Referring to FIG. 2, the aircraft 1 flies in the vicinity of a region below a cloud CL which is negatively charged. Due to an electric field caused by the negative electric charges in the cloud CL (electrostatic induction), the upper side of the aircraft 1 is positively polarized whereas a lower side of the aircraft 1 is negatively polarized.

Note that the cloud CL can sometimes be positively charged, and the aircraft 1 can sometimes be interposed between the negatively charged cloud CL and the positively charged cloud CL as well. Accordingly, the electric charges of the aircraft 1 do not necessarily be polarized to be in a state illustrated in FIG. 2.

FIG. 2 illustrates an example in which the cloud CL is positioned on the right side of a region above the aircraft 1. The positive electric charges are thus biased at a right end of the main wing 12 while being polarized on the upper side of the aircraft 1, whereas the negative electric charges are thus biased at a left end of the main wing 12 while being polarized on the lower side of the aircraft 1. Accordingly, a strong electric field generated at a region where the positive electric charges are concentrated causes breakdown in the air, resulting in leakage of the electric charges from a streamer through a leader. Further, the electric charges no longer be able to be held in the cloud CL can travel toward the region in which the positive electric charges are biased. This can result in coupling of a leader from the cloud CL and a leader extending from the airframe and result in electric discharge, which in turn can lead to generation of lightning strike on the aircraft 1 consequently.

To prevent such lightning strike, it is effective to forecast a position of appearance of the cloud CL at the aircraft 1 or a ground facility and calculate a flight route that allows for prevention of the cloud CL itself. Unfortunately, the appearance of the cloud CL is susceptible to season and air temperature and is irregular accordingly. Even if the appearance of the cloud CL is forecasted successfully, it is difficult to accurately predict a position of occurrence of the lightning strike triggered by the aircraft 1 under the cloud CL actually appeared. One reason is that, although it is easy to predict a position of occurrence of the lightning strike for a cumulonimbus cloud (or a thundercloud) seen in summer, it is difficult to predict a position of occurrence of the lightning strike for cloud streets seen in winter, for example.

Accordingly, the aircraft 1 can receive an influence of lightning strike in the vicinity of the cloud CL in a case where the cloud CL suddenly appears around a flight route, even if the flight route is intended to prevent the lightning strike. At least one embodiment aims to reduce the influence of lightning strike by controlling the attitude of the airframe of the aircraft 1.

The positive electric charges and the negative electric charges in the aircraft 1 are biased primarily depending on a direction of electric field (hereinafter simply referred to as an "electric field direction") around the aircraft 1. Specifically, the electric field having a predetermined direction is formed in the air by the cloud CL, and the positive electric charges and the negative electric charges are biased as illustrated in FIG. 2 when the aircraft 1 flies through the electric field. Accordingly, an example embodiment estimates the electric field direction around the aircraft 1 and changes the attitude of the airframe of the aircraft 1 to an attitude of the airframe that minimizes an influence of the electric field. An example embodiment thus reduces the biasing of the electric charges, i.e., the positive electric charges and the negative electric charges, in the aircraft 1. Described in the following is an example of such a process.

[Process of Controlling Lightning Strike Prevention Attitude]

Figure 3:
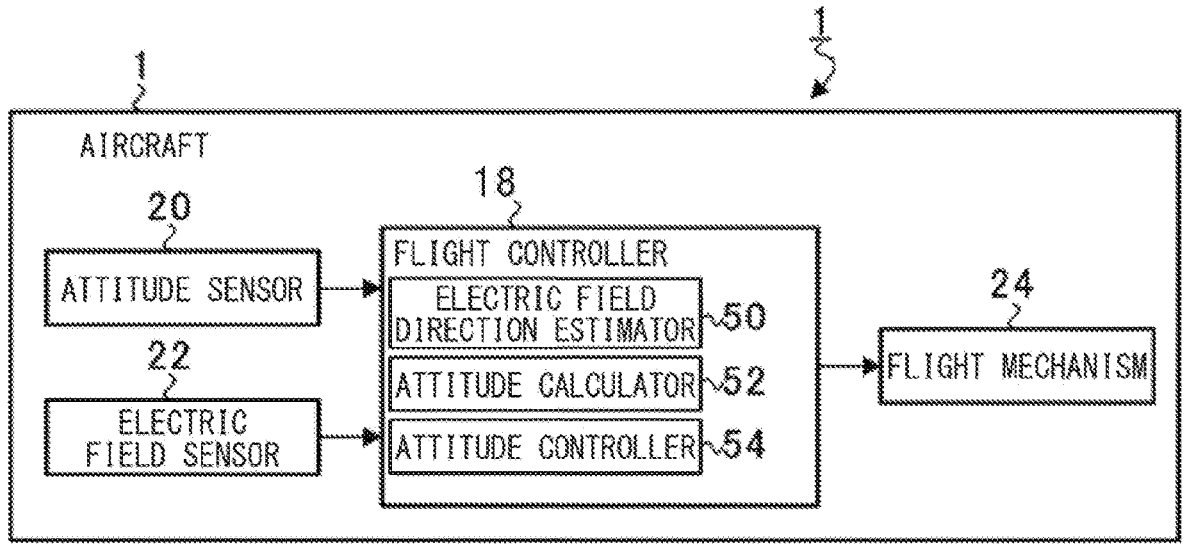
FIG. 3 is a block diagram illustrating an example of a control system of the aircraft.

FIG. 3 is a block diagram illustrating an example of a control system of the aircraft 1. The flight controller 18 may also serve as an electric field direction estimator 50, an attitude calculator 52, and an attitude controller 54 on the basis of cooperation with a program. The electric field direction estimator 50, the attitude calculator 52, and the attitude controller 54 may control the flight mechanism 24 on the basis of detection results acquired by the attitude sensor 20 and the electric field sensor 22. Hereinafter, a description is given of a configuration related to the prevention of the lightning strike according to an example embodiment, and any configuration less related to an example embodiment will not be described in detail. In one embodiment, the electric field direction estimator 50 may serve as an "electric field direction estimator". In one embodiment, the attitude calculator 52 may serve as an "attitude calculator". In one embodiment, the attitude controller 54 may serve as an "attitude controller". In one embodiment, the electric field sensor 22 may serve as an "electric field sensor".

Figure 4:
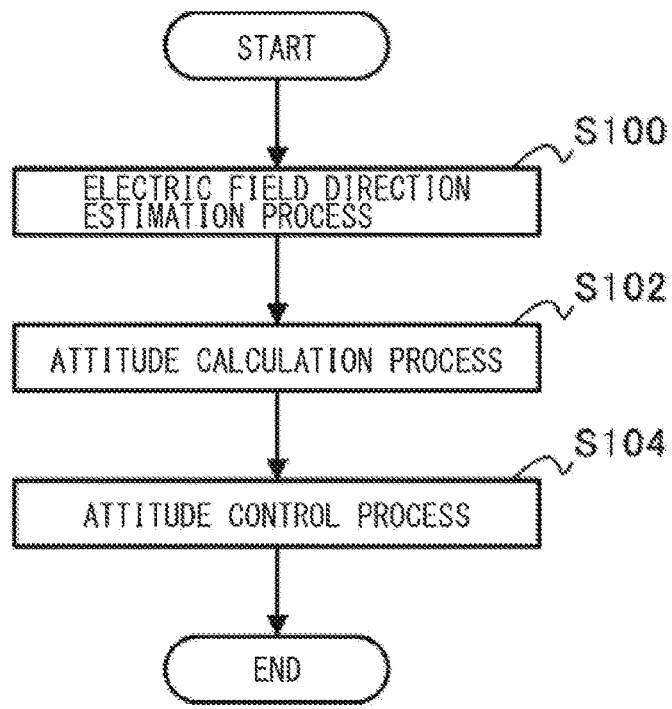
FIG. 4 is a flowchart illustrating an example of a flow of a lightning strike prevention process.

FIG. 4 is a flowchart illustrating an example of a flow of a process of controlling a lightning strike prevention attitude. In an example embodiment, the process of controlling the lightning strike prevention attitude may be executed by the flight controller 18 in accordance with an interrupt signal supplied for each elapse of a predetermined time period. The process of controlling the lightning strike prevention attitude first involves estimating, with the electric field direction estimator 50, the electric field direction around the aircraft 1 on the basis of a detection result acquired by the electric field sensor 22 (S100). Thereafter, the attitude calculator 52 calculates the target airframe attitude that reduces a possibility of the occurrence of the lightning strike on the aircraft 1, on the basis of the electric field direction estimated by the electric field direction estimator 50 (S102). Thereafter, the attitude controller 54 so controls the attitude of the airframe of the aircraft 1 that the target airframe attitude calculated by the attitude calculator 52 is attained (S104). Described in detail hereinafter is each of the processes.

[Electric Field Estimation Process S100]

Figures 5, 6:
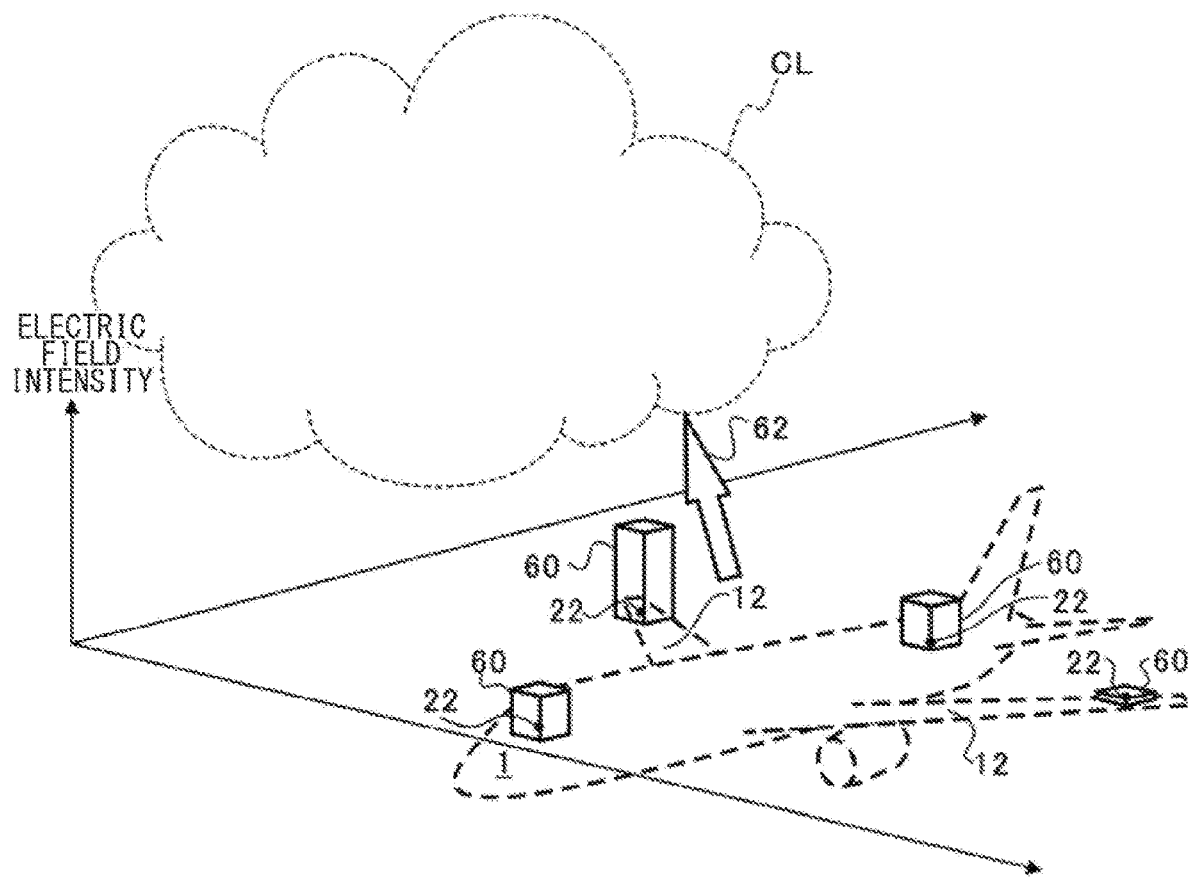
FIG. 5 is a diagram illustrating an example of an electric field intensity distribution.
FIG. 6 is a table in which the electric field intensity distribution and a direction of electric field are associated with each other.

FIG. 5 illustrates an example of an electric field intensity distribution in the aircraft 1. The electric field direction estimator 50 may acquire the electric field intensity of upper side surfaces of the airframe, on the basis of the multiple electric field sensors 22 (four electric field sensors 22 in an example embodiment). FIG. 5 illustrates, in the form of bar graphs 60, the thus-acquired electric field intensities at the respective positions where the corresponding multiple electric field sensors 22 are provided. Note that FIG. 5 illustrates the electric field intensities at the upper side surfaces of the airframe, i.e., the electric field intensities corresponding to the positive electric charges. In an illustrated example, the electric field intensity of the right end of the main wing 12 near the cloud CL is high, whereas the electric field intensity of the left end of the main wing 12 is low. Further, the electric intensities of the nose and the tail, each corresponding to a middle position of the main wing 12, are each substantially at an intermediate value between a value of the electric field intensity of the right end of the main wing 12 and a value of the electric field intensity of the left end of the main wing 12.

FIG. 6 is a table in which the electric field intensity distribution and the electric field direction are associated with each other. FIG. 6 illustrates, in the form of a table, the electric field intensity distribution at the positions of the respective electric field sensors 22 determined in advance, where an electric field is applied to the airframe in multiple electric filed directions at a unit electric field intensity. The electric field direction estimator 50 may acquire the electric field intensities of the positions where the respective electric field sensors 22 are provided, and specify, from the table, an electric field intensity distribution in which the acquired electric field intensities become equal to each other in ratio. For example, assume that a ratio of the electric field intensities acquired by the respective electric field sensors 22 is equal to a ratio of A:B:C:D in FIG. 6. In other words, the electric field intensities of the respective electric field sensors 22 each have a value in which corresponding one of A, B, C, and D is multiplied by a predetermined value. The electric field direction estimator 50 may extract electric field directions E and F corresponding to A, B, C, and D in FIG. 6, and determine the extracted electric field directions E and F as a current electric field direction 62, as denoted by a white arrow in FIG. 5. The electric field direction estimator 50 may thus estimate the electric field direction around the aircraft 1.

Note that an example embodiment may use four symmetrically arranged electric filed sensors 22, although the positions at which the electric field sensors 22 are provided do not necessarily have to be symmetric. In some embodiments, three electric field sensors 22 may be disposed at imbalanced positions to specify the electric field direction. In some embodiments, to specify the electric field direction, the electric field sensors 22 may be disposed at respective vertices of a triangle with the right end and the left end of the main wing 12 each serving as an end of the base. In some embodiments, two electric field sensors 22 may be provided, in an example case where specifying the electric field direction about a single axis, e.g., a pitch axis or the roll axis, suffices.

[Attitude Calculation Process S102]

It can be appreciated from an example illustrated in FIG. 5 that the electric field intensities corresponding to the positive electric charges are higher from the upper left side to the upper right side of the main wing 12 of the aircraft 1. In other words, the positive electric charges are biased on the upper right side of the aircraft 1. Under such circumstances, the lightning strike can occur easily in the vicinity of the right end of the main wing 12 of the aircraft 1 if the aircraft 1 flies in a region in the vicinity of the left side of the cloud CL which is negatively charged. Meanwhile, the electric field intensities corresponding to the negative electric charges are higher from the lower right side to the lower left side of the main wing 12 of the aircraft 1, whereby the negative electric charges are biased on the lower left side of the aircraft 1. Under such circumstances, the lightning strike can occur easily in the vicinity of the left end of the main wing 12 of the aircraft 1 if the aircraft 1 flies in a region in the vicinity of the right side of the cloud CL which is positively charged.

The attitude calculator 52 calculates the target airframe attitude that allows for reduced biasing of the positive electric charges or the negative electric charges, on the basis of the electric field direction estimated by the electric field direction estimator 50. For example, on the basis of the electric field direction estimated by the electric field direction estimator 50, the attitude calculator 52 calculates the target airframe attitude that reduces the possibility of the lightning strike on the aircraft 1 by smoothing the biasing of the electric field intensities.

First, the attitude calculator 52 may calculate a plane formed on the basis of protrusions of the aircraft 1 (hereinafter referred to as a "protrusion plane").

Figure 7:
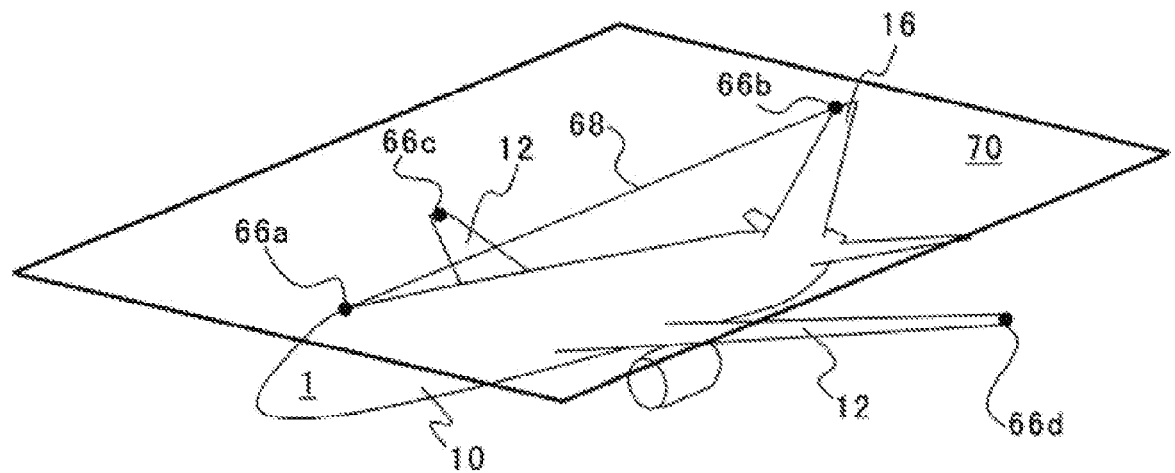
FIG. 7 is a diagram illustrating an example of a protrusion plane.

FIG. 7 illustrates an example of the protrusion plane. For example, the protrusions positioned on the vertical upper side of the aircraft 1 may include: a vertical upper part 66a provided at or near the cockpit positioned at the front of the fuselage 10; a vertical upper part 66b of the vertical tail 16; a right end 66c of the main wing 12; and a left end 66d of the main wing 12.

The attitude calculator 52 may form a plane that is positioned on the vertical upper side of all of the set protrusions, e.g., the vertical upper part 66a, the vertical upper part 66b, the right end 66c, and the left end 66d. For example, the attitude calculator 52 may set, as the protrusion plane 70, a plane including a line 68 that connects the vertical upper part 66a provided at or near the cockpit and the vertical upper part 66b of the vertical tail 16, and in which distances from the right end 66c of the main wing 12 and the left end 66d of the main wing 12 are equal to each other.

In an example embodiment, the protrusion plane 70 may be the plane positioned on the vertical upper side of all of the protrusions, e.g., the vertical upper part 66a, the vertical upper part 66b, the right end 66c, and the left end 66d. However, forming the protrusion plane 70 on the basis of the protrusions of the aircraft 1, e.g., the vertical upper part 66a, the vertical upper part 66b, the right end 66c, and the left end 66d, suffices. For example, an approximate plane based on the protrusions, e.g., the vertical upper part 66a, the vertical upper part 66b, the right end 66c, and the left end 66d, may be set as the protrusion plane 70. In some embodiments, the approximate plane may be a plane in which a total of distances from the vertical upper part 66a, the vertical upper part 66b, the right end 66c, and the left end 66d becomes the minimum.

In an example embodiment, the attitude calculator 52 may calculate the protrusion plane on the basis of shapes of the protrusions, e.g., the vertical upper part 66a, the vertical upper part 66b, the right end 66c, and the left end 66d, that are equal to each other. Note that densities of electric charges can differ depending on the shapes of the protrusions, e.g., the vertical upper part 66a, the vertical upper part 66b, the right end 66c, and the left end 66d. For example, the electric charges can become dense, which can increase the electric field intensity and thus lead to easier occurrence of the lightning strike if a shape of any of the protrusions, e.g., the vertical upper part 66a, the vertical upper part 66b, the right end 66c, and the left end 66d is sharp or a corner thereof is at an acute angle. Meanwhile, if the shape of any of the protrusions, e.g., the vertical upper part 66a, the vertical upper part 66b, the right end 66c, and the left end 66d is flat or spherical, or the corner thereof is at an obtuse angle, the electric charges are dispersed, which decreases the electric field intensity and thus makes the lightning strike difficult to occur. Accordingly, in some embodiments, the attitude calculator 52 may calculate the protrusion plane 70 not only on the basis of the positions of the protrusions, e.g., the vertical upper part 66a, the vertical upper part 66b, the right end 66c, and the left end 66d, but also on the basis of the shape of any of the protrusions. For example, if the shape of any of the protrusions is at the acute angle, the attitude calculator 52 may calculate the protrusion plane 70 by causing the position of the relevant protrusion to be shifted toward the outer side of the airframe.

Note that the cloud CL is positioned on the vertical upper side of the aircraft 1 and the protrusion plane 70 may be formed on the basis of the protrusions that are positioned on the vertical upper side of the aircraft 1 accordingly in an example embodiment. In some embodiments, a protrusion to be subjected to the formation of the protrusion plane 70 may be changed depending on a position of the cloud CL. For example, a protrusion positioned on the vertical lower side of the aircraft 1, such as a lower part of the fuselage may be subjected to the formation of the protrusion plane 70 in a case where the cloud CL is positioned on the vertical lower side of the aircraft 1.

Thereafter, the attitude calculator 52 may calculate the target airframe attitude in which the protrusion plane 70 intersects perpendicularly with the electric field direction 62 estimated by the electric field direction estimator 50. Upon calculating such a target airframe attitude, the attitude calculator 52 may decompose the electric field direction 62 into the pitch axis and the roll axis.

Figure 8:
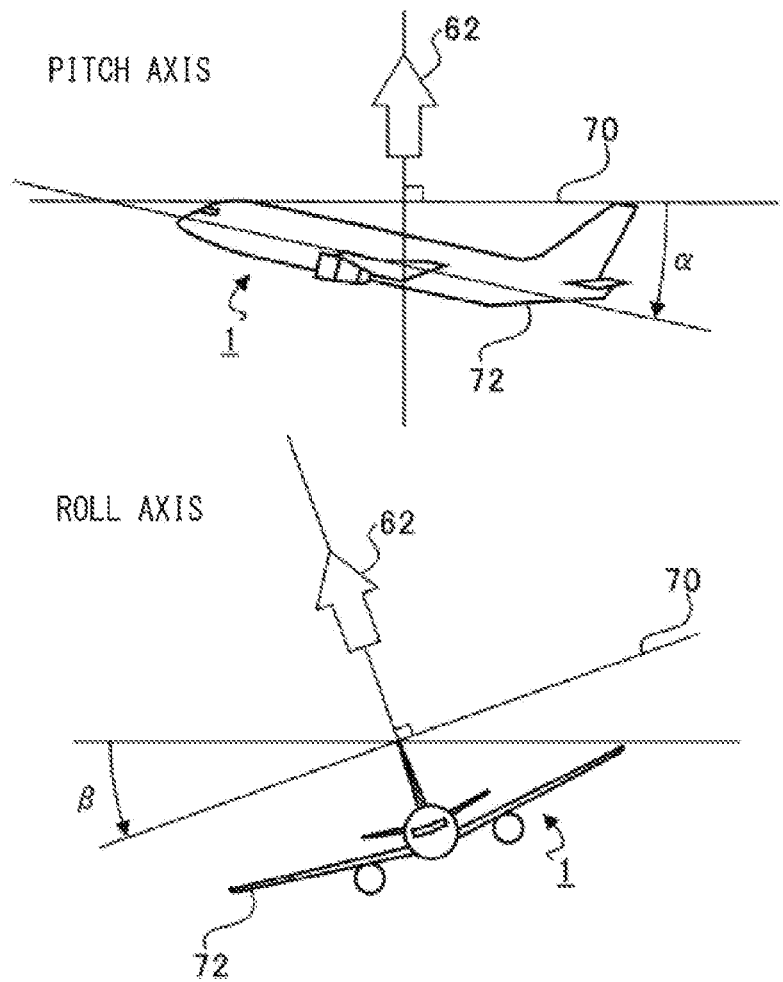
FIG. 8 is a diagram illustrating an example of a target airframe attitude.

FIG. 8 illustrates an example of the target airframe attitude. Referring to FIG. 8, for example, the attitude calculator 52 may calculate a target airframe attitude 72 in which an angle about the pitch axis (the pitch angle) is tilted at an angle of α degrees such that the protrusion plane 70 becomes perpendicular to the electric field direction 62. In addition, the attitude calculator 52 may calculate the target airframe attitude 72 in which an angle about the roll axis (the roll angle) is tilted at an angle of β degrees such that the protrusion plane 70 becomes perpendicular to the electric field direction 62. In an example embodiment, the attitude calculator 52 may cause the attitude of the airframe of the aircraft 1 to be the target airframe attitude 72 in which the protrusion plane 70 and the electric field direction 62 intersect perpendicularly with each other to thereby make the electric field intensities at the respective protrusions even.

In some embodiments, the attitude calculator 52 may calculate the target airframe attitude 72 within a range that allows for continuation of a stable flight (e.g., within the pitch angle from −30 degrees to +30 degrees and the roll angle from −30 degrees to +30 degrees) and within a range that does not significantly change a flight route. Accordingly, the attitude calculator 52 may limit the target airframe attitude 72 within the range that allows for the continuation of the stable flight and within the range that does not significantly change the flight route, in a case where the target airframe attitude 72 in which the protrusion plane 70 intersects perpendicularly with the electric field direction 62 is determined as interfering with the stable flight or as requiring a significant change in the flight route.

Note that the attitude calculator 52 may calculate the target airframe attitude 72 on the basis of the electric field intensity distribution at a certain point of time, although the calculation of the target airframe attitude 72 is not limited thereto. In some embodiments, the attitude calculator 52 may calculate the target airframe attitude 72 on the basis of a time change of the electric field intensity distribution that changes from moment to moment. For example, the attitude calculator 52 may calculate the target airframe attitude 72 on the basis of the time change of the electric field intensity distribution by means of a control such as a PID (Proportional-Integral-Differential) control.

[Attitude Control Process S104]

The attitude controller 54 controls the attitude of the airframe of the aircraft 1 to cause the attitude of the airframe to be the target airframe attitude 72 calculated by the attitude calculator 52. For example, the attitude controller 54 may first provide the pilot with information or a warning that the attitude of the airframe of the aircraft 1 is to be set to the target airframe attitude 72 calculated by the attitude calculator 52. If the pilot accepts the setting of the attitude of the airframe of the aircraft 1 to the target airframe attitude 72, the attitude controller 54 may input the target airframe attitude 72 as an input of operation. This helps to attain the target airframe attitude 72 that reduces the possibility of the lightning strike while preventing the pilot from being perplexed by a sudden change in the attitude of the airframe.

In some embodiments, the attitude controller 54 may notify, by means of a device such as a display, the pilot of the target airframe attitude 72 itself calculated by the attitude calculator 52. In this case, the pivot may visually confirm the target airframe attitude 72 to control the attitude of the airframe of the aircraft 1 manually. This helps to attain the target airframe attitude 72 with the target airframe attitude 72 being recognized by the pilot.

Figure 9:
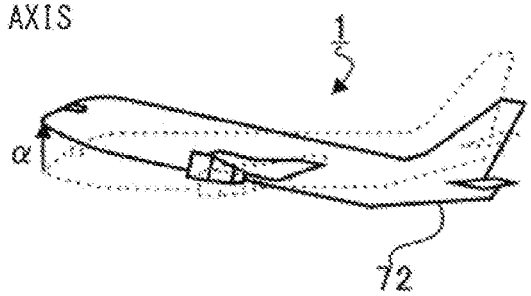
FIG. 9 is a diagram illustrating an example of an attitude control process.
Figure 9:
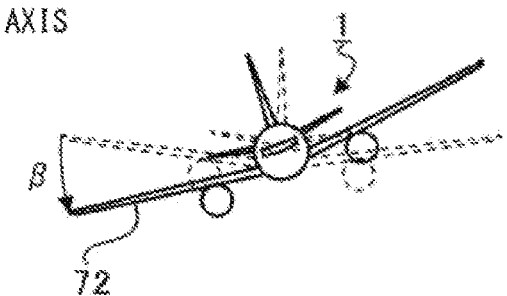

FIG. 9 illustrates an example of an attitude control process. Referring to FIG. 9, the attitude controller 54 may tilt the nose toward the vertical upper side at the pitch angle of $\alpha$ degrees and cause the bank angle to be tilted at the roll angle of $\beta$ degrees, on the basis of the inputted target airframe attitude 72. The attitude controller 54 may control the attitude of the airframe by performing feedback of the detection result acquired by the attitude sensor 20, with the target airframe attitude 72 being the target.

After the attitude of the airframe is set to the target airframe attitude 72, the flight controller 18 may acquire the electric field intensities of the respective electric field sensors 22 again. The flight controller 18 may execute the processes starting from the electric field estimation process S100 again in a case where deviation of any of the electric field intensities exceeds a predetermined range.

In some embodiments, the attitude controller 54 may adjust a rate of changing the attitude of the airframe, instead of controlling the attitude of the airframe to be the target airframe attitude 72 immediately. For example, the attitude of the airframe may be so changed to the target airframe attitude, inputted on the basis of a first order lag filter, as to involve a predetermined time constant. This helps to ensure a safety of the pilot and a passenger even upon rapidly changing the attitude of the airframe due to appearance of the cloud CL.

It is to be also noted that the table illustrated in FIG. 6, in which the electric field intensity distribution and the electric field direction are associated with each other, may be used to estimate the electric field direction in an example embodiment. In some embodiments, the plurality of electric field sensors 22 disposed symmetrically with respect to the roll axis of the airframe (e.g., the electric field sensors 22 disposed on the right end of the main wing 12 and the left end of the main wing 12) may be used to control the attitude of the aircraft 1 such that the detection results (e.g., the electric field intensities) acquired by the plurality of electric field sensors 22 (e.g., two electric field sensors) become equal to each other. In such embodiments, the attitude calculator 52 may calculate the target airframe attitude 72 and the attitude controller 54 may control the attitude of the airframe of the aircraft 1, on the basis of the electric field direction estimated substantially on the basis of the detection results acquired by the symmetrically-disposed electric field sensors 22.

With the configuration according to an example embodiment described above, it is possible to make the electric field intensity distribution corresponding to both the positive electric charges and the negative electric charges even and thus cause the attitude of the airframe of the aircraft 1 to be the airframe attitude that reduces the possibility of the lightning strike on the aircraft 1. Hence, it is possible to reduce the influence of the lightning strike.

An example embodiment described above may reduce, in a case where the cloud CL is appeared around the flight route, the influence of the lightning strike by controlling the attitude of the airframe of the aircraft 1, in a region that is in the vicinity of the cloud CL and in which a possibility of the occurrence of the lightning strike triggered by the aircraft 1 is high. Depending on a flight situation, however, a desired attitude of the airframe can be unachievable, or a deviation can occur from a desired flight route due to the sudden control of the attitude of the airframe. Accordingly, an example embodiment may calculate a flight route that allows for a control that changes the attitude of the airframe of the aircraft 1 to the airframe attitude that reduces the possibility of the lightning strike to thereby reduce the influence of the lightning strike, upon passing through the region in the vicinity of the cloud CL, i.e., upon passing through the region that is in the vicinity of the cloud CL and in which the possibility of the occurrence of the lightning strike is high. Described in the following is an example of such a process.

[Process of Controlling Lightning Strike Prevention Route]

Figure 10:
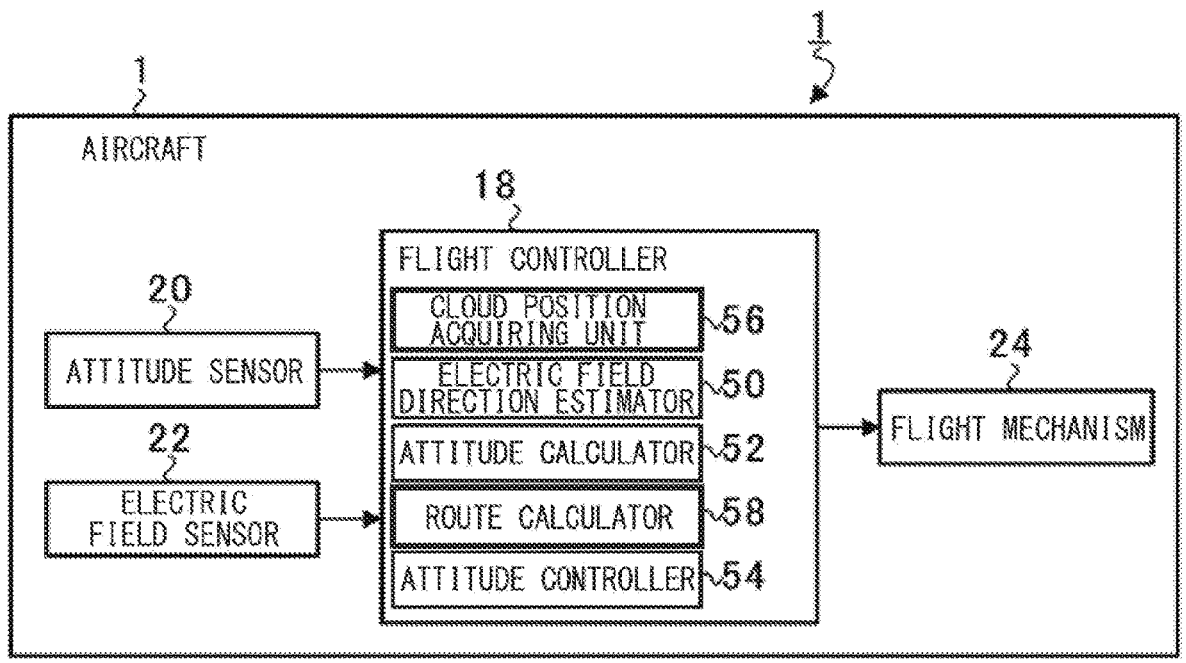
FIG. 10 is a block diagram illustrating another example of the control system of the aircraft.

FIG. 10 is a block diagram illustrating another example of the control system of the aircraft 1. The flight controller 18 may also serve as a cloud position acquiring unit 56 and a route calculator 58 in addition to the electric field direction estimator 50, the attitude calculator 52, and the attitude controller 54, on the basis of cooperation with a program. Note that the attitude calculator 52 and the attitude controller 54 are substantially similar in operation to those described above in an example embodiment and hence they are not described in detail. Hereinafter, a description is given mainly of the electric field direction estimator 50 that differs in operation from that described above, the cloud position acquiring unit 56, and the route calculator 58.

Figure 11:
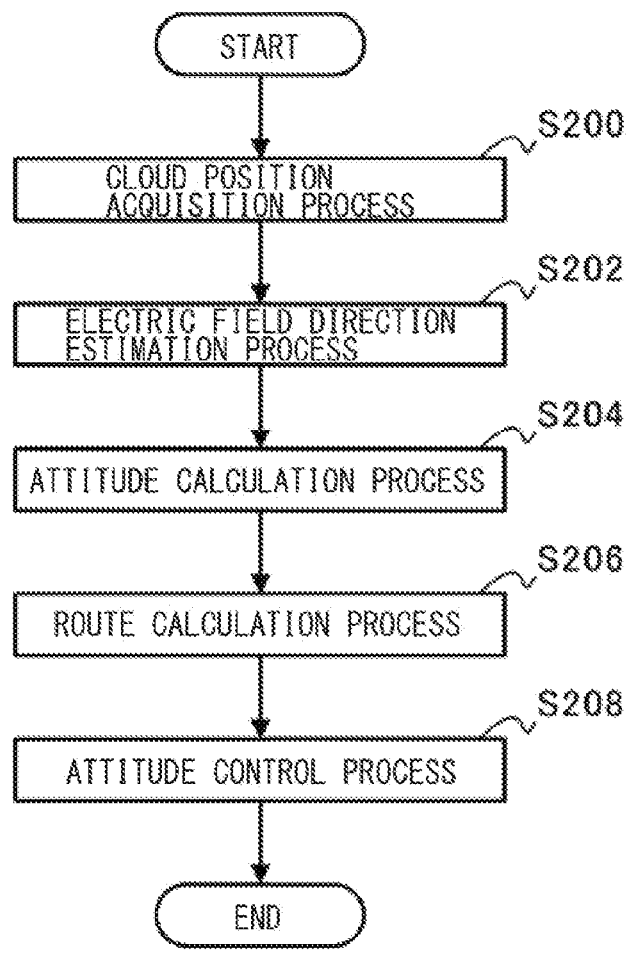
FIG. 11 is a flowchart illustrating an example of a flow of a process of controlling a lightning strike prevention route.

FIG. 11 is a flowchart illustrating an example of a flow of a process of controlling a lightning strike prevention route. In an example embodiment, the process of controlling the lightning strike prevention route may be executed by the flight controller 18 in accordance with an interrupt signal supplied for each elapse of a predetermined time period. The process of controlling the lightning strike prevention route may first involve acquiring, with the cloud position acquiring unit 56, a position of the cloud CL (S200). Thereafter, the electric field direction estimator 50 may estimate the electric field direction that is at the time of passing through the region in the vicinity of the cloud CL, on the basis of the position of the cloud CL acquired by the cloud position acquiring unit 56 and on the basis of the flight route (S202). Thereafter, the attitude calculator 52 may calculate the target airframe attitude that reduces the possibility of the occurrence of the lightning strike on the aircraft 1, on the basis of the electric field direction estimated by the electric field direction estimator 50 (S204). Thereafter, the route calculator 58 may calculate a flight route again such that the target airframe attitude calculated by the attitude calculator 52 is maintained in the region in the vicinity of the cloud CL (S206). Thereafter, the attitude controller 54 may so control the attitude of the airframe of the aircraft 1 that the target airframe attitude calculated by the attitude calculator 52 is attained upon passing through the region in the vicinity of the cloud CL (S208). Described in detail hereinafter is each of the processes.

[Cloud Position Acquisition Process S200]

The cloud position acquiring unit 56 may acquire the position of the cloud CL. For example, the cloud position acquiring unit 56 may acquire the position of the cloud CL in the vicinity of the flight route. The position of the cloud CL may be identified in a variety of ways. For example, the position of the cloud CL may be acquired on the basis of data on forecast of the cloud CL acquired from the outside, or may be acquired from any preceding aircraft 1.

For acquiring the position of the cloud CL on the basis of the data on forecast of the cloud CL acquired from the outside, the ground facility is able to identify the position of the appearance of the cloud CL forecasted by weather radar, for example. The ground facility is also able to estimate the position of the cloud CL at a predetermined future time, on the basis of the position of the cloud CL, a direction of the wind near the cloud CL, and a wind speed near the cloud CL. The cloud position acquiring unit 56 may acquire, in the form of the forecast data of the cloud CL, the position of the cloud CL, at the time of traveling along each flight route, in the vicinity of the flight route estimated by the ground facility, for example. The cloud position acquiring unit 56 may also acquire a size of the cloud CL, a type of the cloud CL, and a charge amount of the cloud CL, in addition to the position of the cloud CL.

For acquiring the position of the cloud CL on the basis of any preceding aircraft 1, the aircraft 1 is able to estimate, with the electric field direction estimator 50, the electric field direction around the aircraft 1 on the basis of the detection results acquired by the electric field sensors 22. Accordingly, the other preceding aircraft 1 may temporarily hold the electric field direction estimated by the electric field direction estimator 50. The cloud position acquiring unit 56 may then acquire, from the other aircraft 1 that flies ahead of the own aircraft 1, the electric field direction around the flight route of the own aircraft 1. Thus, the cloud position acquiring unit 56 may acquire data on the electric field direction equivalent to data on the position of the cloud CL.

[Electric Field Estimation Process S202]

Figure 12:
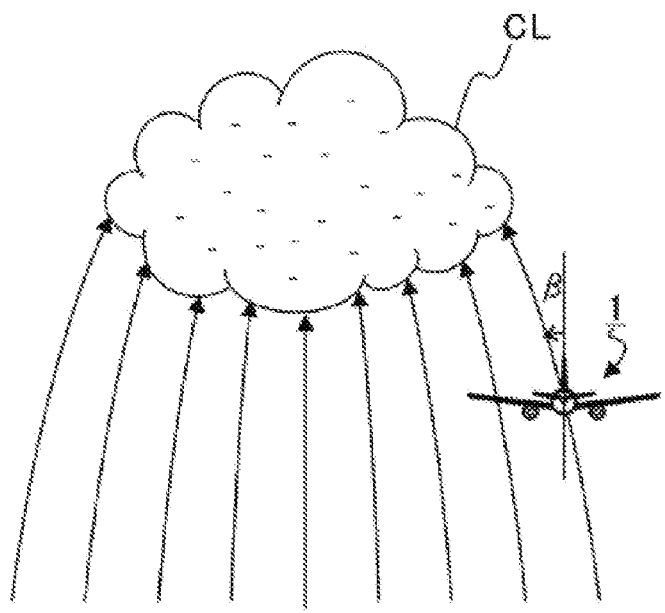
FIG. 12 is a diagram illustrating an example of a direction of electric field.

FIG. 12 illustrates an example of the electric field direction. For convenience of description, a description is given below of the electric field direction about the roll axis of the aircraft 1. In some embodiments, the electric field direction about the pitch axis may be calculated.

In a case where the cloud position acquiring unit 56 has acquired the position of the cloud CL estimated by the ground facility, the electric field direction estimator 50 may estimate an electric field, i.e., an electrical line of force, in the region in the vicinity of the cloud CL as denoted by solid arrows in FIG. 12, on the basis of the position, the size, the type, and the charge amount of the cloud CL.

Thereafter, the electric field direction estimator 50 may identify a positional relationship between the cloud CL and the aircraft 1, on the basis of the flight route of the own aircraft 1. For example, as illustrated in FIG. 12 that illustrates an example in which the aircraft 1 is scheduled to fly at the position illustrated in FIG. 12 toward the back side of FIG. 12 relative to the cloud CL, the aircraft 1 passes through a region positioned on the lower right side of the cloud CL as illustrated in FIG. 12. Accordingly, in this example, the electric field direction estimator 50 may identify the direction of the electrical line of force in the region in the vicinity of the aircraft 1, e.g., a roll angle β° in this example, and may determine the electric field direction on the basis of the roll angle β°.

In a case where the cloud position acquiring unit 56 has acquired the electric field direction around the flight route from the other aircraft 1, the electric field direction estimator 50 may utilize the electric field direction as it is. The electric field direction estimator 50 may thus estimate the electric field direction around the aircraft 1 at the time of passing through the region in the vicinity of the cloud CL.

[Attitude Calculation Process S204]

The attitude calculator 52 may calculate the target airframe attitude that reduces the possibility of the occurrence of the lightning strike on the aircraft 1, on the basis of the electric field direction estimated by the electric field direction estimator 50. A procedure to calculate the target airframe attitude has been already described in the foregoing example embodiment with reference to FIG. 5 and will not be described in detail accordingly.

[Route Calculation Process S206]

The route calculator 58 may calculate the flight route again such that the target airframe attitude calculated by the attitude calculator 52 is maintained in the region in the vicinity of the cloud CL.

Figure 13:
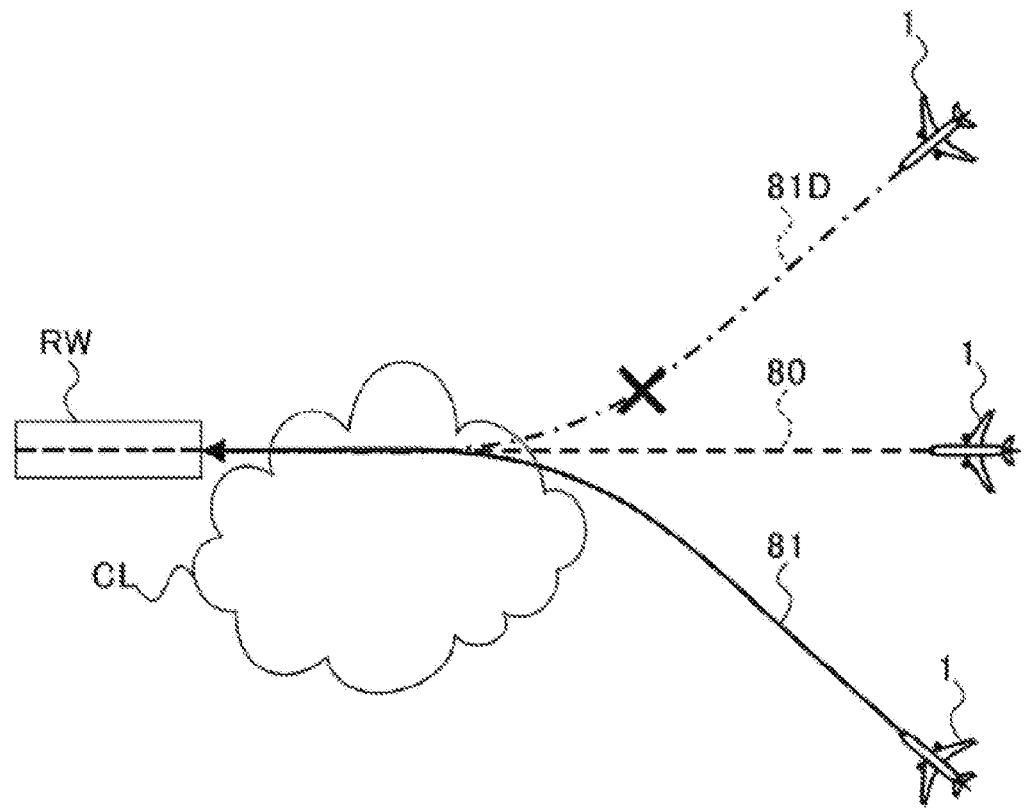
FIG. 13 is a diagram illustrating an example of flight routes.

FIG. 13 illustrates an example of flight routes, and illustrates an example case where the aircraft 1 is to land on a runway RW. In other words, the destination of the aircraft 1 is the runway RW. For example, the aircraft 1 is scheduled to fly along the flight route denoted by a broken line in FIG. 13. Under such circumstances, however, the aircraft 1 is expected, on the basis of the position of the cloud CL acquired by the cloud position acquiring unit 56, to pass through the region in the vicinity of the cloud CL before landing on the runway RW. In such a case, the aircraft 1 can involve the biasing of the positive electric charges and the negative electric charges due to the electric field of the cloud CL upon passing through the region in the vicinity of the cloud CL, which can lead to the occurrence of the lightning strike triggered by the aircraft 1.

Accordingly, as described above, the electric field direction estimator 50 may estimate the electric field direction at the time of passing through the region in the vicinity of the cloud CL, on the basis of the position of the cloud CL acquired by the cloud position acquiring unit 56 and on the basis of the flight route. Thereafter, the attitude calculator 52 may calculate the target airframe attitude that reduces the possibility of the occurrence of the lightning strike on the aircraft 1, on the basis of the electric field direction estimated by the electric field direction estimator 50. For example, the attitude calculator 52 may calculate, as the target airframe attitude, an attitude in which the roll axis is rotated at a predetermined angle, i.e., an attitude that is rotated counterclockwise with the nose being the front, in an example illustrated in FIG. 13.

Thereafter, the route calculator 58 may calculate a flight route 81, denoted by a solid line in FIG. 13, again such that the target airframe attitude calculated by the attitude calculator 52 is maintained in the region in the vicinity of the cloud CL. In an example illustrated in FIG. 13, the aircraft 1 may turn for a predetermined period of time on the basis of the target airframe attitude, i.e., the attitude that is rotated counterclockwise with the nose being the front; hence, the route calculator 58 may calculate the flight route 81 that is positioned on the left side of an original flight route 80.

Note that, if the aircraft 1 is caused to fly along a flight route 81D denoted by a dashed-dotted line in FIG. 13 which is positioned on the right side of the original flight route 80, the attitude of the airframe is rotated clockwise at a predetermined angle with the nose being the front and the left end of the main wing 12 faces the cloud CL in the electric field direction consequently upon the turning. This results in further increase in the possibility of the occurrence of the lightning strike on the aircraft 1 as compared with that based on the original flight route 80. Accordingly, in an example illustrated in FIG. 13, the route calculator 58 may advantageously calculate the flight route 81 that is positioned on the left side of the original flight route 80.

Described above is an example in which the route calculator 58 calculates the flight route 81 on the basis of the electric field direction at the time of passing through the region in the vicinity of the cloud CL, although an embodiment of the technology is not limited thereto. In some embodiments, the route calculator 58 may calculate the flight route 81 on the basis of the electric field direction and the electric field intensity as well. In such embodiments, the route calculator 58 may first preferentially avoid a route along which the electric field intensity becomes high. Then, if the aircraft 1 still has to pass through the region in the vicinity of the cloud CL in which the possibility of the occurrence of the lightning strike is high, the route calculator 58 may calculate the target airframe attitude that reduces the possibility of the occurrence of the lightning strike on the aircraft 1 in that region in which the possibility of the occurrence of the lightning strike is high, on the basis of the electric field direction estimated by the electric field direction estimator 50.

In some embodiments, upon landing of the aircraft 1 on the runway RW, the route calculator 58 may calculate the flight route 81 not only on the basis of the electric field direction and the electric field intensity but also another factor. Non-limiting examples of the other factor may include an approaching position, an approaching angle, a minimum turning radius, a flight distance that allows for a flight on the basis of a remaining fuel amount, and an altitude, which are required to approach the runway RW. Any known technique may be used to reflect parameters required to approach the runway RW and a description thereof will not be described in detail here.

[Attitude Control Process S208]

The attitude controller 54 may so control the attitude of the airframe of the aircraft 1 that the target airframe attitude calculated by the attitude calculator 52 is attained upon passing through the vicinity of the cloud CL while flying along the flight route 81 newly calculated by the route calculator 58. The control of the attitude of the aircraft 1 has been already described in the foregoing example embodiment with reference to FIG. 9 and will not be described in detail accordingly.

The configuration described above according to an example embodiment makes the electric field intensity distribution corresponding to both the positive electric charges and the negative electric charges even upon passing through the region in the vicinity of the cloud CL even in a case where the cloud CL is present around the flight route 81, and thus causes the attitude of the airframe of the aircraft 1 to be the airframe attitude that reduces the possibility of the lightning strike on the aircraft 1. Hence, it is possible to reduce the influence of the lightning strike while helping to ensure the safety of the pilot and the passenger.

Note that the flight route is often longer than a width of the cloud CL, meaning that the scheduled flight route 81 can sometimes involve a plurality of clouds CL. An example embodiment makes it possible to reduce the influence of the lightning strike appropriately even in a case where the flight route 80 involves the plurality of clouds CL.

Figure 14:
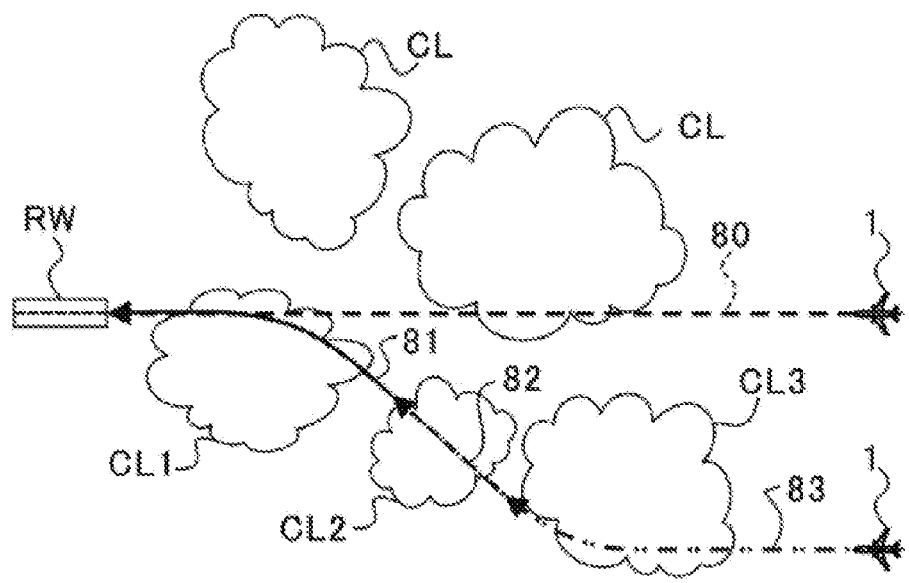
FIG. 14 is a diagram illustrating an example of flight routes.

FIG. 14 is a diagram illustrating an example of flight routes. FIG. 14 again illustrates an example in which the aircraft 1 is to land on the runway RW. In an example illustrated in FIG. 14, the aircraft 1 is scheduled to fly along the flight route 80 denoted by a broken line in FIG. 14, but the aircraft 1 is expected, on the basis of the positions of the clouds CL acquired by the cloud position acquiring unit 56, to pass through regions in the vicinity of the plurality of clouds CL before landing of the aircraft 1 on the runway RW.

The attitude calculator 52 may calculate a plurality of target airframe attitudes on a time-series basis in accordance with a change in positional relationship between the aircraft 1 and the plurality of clouds CL. The route calculator 58 may calculate the flight route such that the aircraft 1 is able to fly while maintaining the plurality of target airframe attitudes.

For example, the attitude calculator 52 may calculate, for a cloud CL1 near the runway RW, the target airframe attitude that reduces the possibility of the lightning strike on the aircraft 1, on the basis of the electric field direction estimated by the electric field direction estimator 50 (or on the basis of the electric field direction and the electric field intensity). In an example case where the target airframe attitude calculated by the attitude calculator 52 is an attitude in which the roll axis is rotated at a predetermined angle (e.g., rotated in left rotation with the nose being the front), the route calculator 58 may calculate the flight route 81 denoted by the solid line in FIG. 14 such that the aircraft 1 is able to fly while maintaining the target airframe attitude calculated by the attitude calculator 52 in the region in the vicinity of the cloud CL1.

Thereafter, the attitude calculator 52 may calculate, for a cloud CL2 through which the aircraft 1 is to travel in order to fly along the flight route 81, the target airframe attitude that reduces the possibility of the lightning strike on the aircraft 1, on the basis of the electric field direction estimated by the electric field direction estimator 50 (or on the basis of the electric field direction and the electric field intensity). In an example case where the target airframe attitude calculated by the attitude calculator 52 is an attitude in which the roll axis is maintained horizontally, the route calculator 58 may calculate a flight route 82 denoted by a dashed-dotted line in FIG. 14 such that the aircraft 1 is able to fly while maintaining the target airframe attitude calculated by the attitude calculator 52 in the region in the vicinity of the cloud CL2.

Thereafter, the attitude calculator 52 may calculate, for a cloud CL3 through which the aircraft 1 is to travel in order to fly along the flight route 82, the target airframe attitude that reduces the possibility of the lightning strike on the aircraft 1, on the basis of the electric field direction estimated by the electric field direction estimator 50 (or on the basis of the electric field direction and the electric field intensity). In an example case where the target airframe attitude calculated by the attitude calculator 52 is an attitude in which the roll axis is rotated at a predetermined angle (e.g., rotated in right rotation with the nose being the front), the route calculator 58 may calculate a flight route 83 denoted by a dashed-two dotted line in FIG. 14 such that the aircraft 1 is able to fly while maintaining the target airframe attitude calculated by the attitude calculator 52 in the region in the vicinity of the cloud CL3.

As described above, the calculation of the target airframe attitude and the calculation of the flight route may be repeated backward from a target position, i.e., repeated in the inverse order on a time-series basis from the target position. Note that an existing technique may be used to calculate, for example, a flight route that allows for a shortest flight distance or a lowest fuel consumption for any airspace with no cloud CL. The configuration described above according to an example embodiment causes the attitude of the airframe of the aircraft 1 to be the airframe attitude that reduces the possibility of the lightning strike on the aircraft 1 and thus makes it possible to reduce the influence of the lightning strike, even in a case where the flight route involves the plurality of clouds CL.

Note that the electric field direction in the vicinity of the aircraft 1 may be calculated for each of the clouds CL in an example embodiment described above. In some embodiments, where the cloud CL is large and thus the electric field, i.e., the electrical line of force, varies in accordance with the flight route, the electric field direction in the vicinity of the aircraft 1 may be calculated by regarding the large cloud CL as the plurality of clouds CL.

It is to be also noted that an influence can possibly be imposed on a factor such as a flight distance or a fuel consumption if the attainment of the target airframe attitude that reduces the possibility of the lightning strike on the aircraft 1 is prioritized to strictly calculate the safe flight route. Accordingly, in some embodiments, the target airframe attitude may be adjusted within a range in which the flight route less influences or does not influence the factor such as the flight distance to the destination or the fuel consumption. For example, the attitude calculator 52 may so correct the target airframe attitude as to allow the flight route to approximate the shortest flight route, and the route calculator 58 may calculate the flight route on the basis of the target airframe attitude corrected by the attitude calculator 52.

In addition, an example embodiment described above allows the attitude of the aircraft 1 to maintain the target airframe attitude upon passing through the region in the vicinity of the cloud CL. However, a state of the electric field can change depending on a state of the cloud CL. In some embodiments, the electric field direction may be calculated as described above in real time by the electric field sensor 22 to control the attitude of the aircraft 1 in accordance with the changes in the electric field direction.

The configuration described above according to an example embodiment makes the electric field intensity distribution corresponding to both the positive electric charges and the negative electric charges even and thus allows for the calculation of the flight route that causes the attitude of the airframe of the aircraft 1 to be the airframe attitude that reduces the possibility of the lightning strike on the aircraft 1. Hence, it is possible to reduce the influence of the lightning strike while helping to ensure the safety of the pilot and the passenger.

Although some example embodiments of the technology have been described in the foregoing by way of example with reference to the accompanying drawings, the technology is by no means limited to the embodiments described above. It should be appreciated that modifications and alterations may be made by persons skilled in the art without departing from the scope as defined by the appended claims. The technology is intended to include such modifications and alterations in so far as they fall within the scope of the appended claims or the equivalents thereof.

For example, in an example embodiment described above, four or more electric field sensors 22 may be provided on the aircraft 1 and the electric field direction estimator 50 may estimate the electric field direction around the aircraft 1 on the basis of the detection results acquired by the electric field sensors 22. An embodiment of the technology, however, is not limited thereto. In some embodiments, one electric field sensor 22 may be provided on an upper side of the fuselage 10 and one electric field sensor 22 may be provided on a lower side of the fuselage 10. In such embodiments, the electric field direction estimator 50 may estimate the electric field direction around the aircraft 1 on the basis of the detection results acquired by the two electric field sensors 22.

At least one embodiment also provides a program that causes a computer to operate as the flight controller 18, and a computer-readable recording medium that stores the program. Non-limiting examples of the recording medium may include a flexible disk, a magneto-optical disk, ROM, CD, DVD (Registered Trademark), and BD (Registered Trademark). As used herein, the term "program" may refer to a data processor written in any language and any description method.

The aircraft 1 may include all of the electric field direction estimator 50, the attitude calculator 52, and the attitude controller 54, or all of the electric field direction estimator 50, the attitude calculator 52, the attitude controller 54, the cloud position acquiring unit 56, and the route calculator 58 in an example embodiment described above. In some embodiments, the ground facility may include all or a part of the electric field direction estimator 50, the attitude calculator 52, the attitude controller 54, the cloud position acquiring unit 56, and the route calculator 58. In such embodiments, the flight of the aircraft 1 may be controlled entirely or partly on the basis of a result acquired by the ground facility.

All or a part of the processes of each of the process of controlling the lightning strike prevention attitude and the process of controlling the lightning strike prevention route as disclosed herein do not necessarily have to be processed on a time-series basis in the order described in the example flowcharts. All or a part of the processes may involve parallel processing or processing based on subroutine.

The flight controller 18 illustrated in FIGS. 3 and 10 is implementable by circuitry including at least one semiconductor integrated circuit such as at least one processor (e.g., a central processing unit (CPU)), at least one application specific integrated circuit (ASIC), and/or at least one field programmable gate array (FPGA). At least one processor is configurable, by reading instructions from at least one machine readable non-transitory tangible medium, to perform all or a part of functions of the flight controller 18. Such a medium may take many forms, including, but not limited to, any type of magnetic medium such as a hard disk, any type of optical medium such as a CD and a DVD, any type of semiconductor memory (i.e., semiconductor circuit) such as a volatile memory and a nonvolatile memory. The volatile memory may include a DRAM and a SRAM, and the nonvolatile memory may include a ROM and a NVRAM. The ASIC is an integrated circuit (IC) customized to perform, and the FPGA is an integrated circuit designed to be configured after manufacturing in order to perform, all or a part of the functions of the flight controller 18 illustrated in FIGS. 3 and 10.

The invention claimed is:

1. An aircraft comprising:
   a fuselage;
   a main wing attached to the fuselage and configured to generate lift that acts on the aircraft;
   electric field sensors configured to detect electric field intensities at a plurality of positions of the aircraft; and
   a flight controller including:
   an electric field direction estimator configured to, based on information on relationships between directions of electric fields around the aircraft and electric field intensity distributions on the aircraft, estimate a direction of an electric field around the aircraft from the detected electric field intensities at the plurality of positions of the aircraft;

an attitude calculator configured to calculate a target airframe attitude to control an airframe attitude of the aircraft so that the electric field intensity distribution on the aircraft becomes uniform relative to the direction of the electric field estimated by the electric field direction estimator, in which the electric field intensity distribution comprises one or more non-zero values; and an attitude controller configured to control the airframe attitude of the aircraft to cause the airframe attitude to be the target airframe attitude calculated by the attitude calculator, and select a flight route that aligns with the target airframe attitude to be calculated by the attitude calculator to minimize a risk of lightning strikes on the aircraft.

2. The aircraft according to claim 1, wherein the attitude calculator is configured to calculate, as the target airframe attitude, the airframe attitude in which a plane intersects perpendicularly with the direction of the electric field, the plane being based on positions of respective protrusions of the aircraft.

3. The aircraft according to claim 1, wherein the attitude calculator is configured to calculate, as the target airframe attitude, the airframe attitude in which a plane intersects perpendicularly with the direction of the electric field, the plane being based on positions of respective protrusions of the aircraft and a shape of any of the protrusions.

4. A flight controller for an aircraft, the flight controller comprising:

an electric field direction estimator configured to receive electric field intensities at a plurality of positions of the aircraft to estimate a direction of an electric field around the aircraft based on information on relationships between directions of electric fields around the aircraft and electric field intensity distributions on the aircraft;

an attitude calculator configured to calculate a target airframe attitude to control an airframe attitude of the aircraft so that the electric field intensity distribution on the aircraft becomes uniform relative to the direction of the electric field estimated by the electric field direction estimator, in which the electric field intensity distribution comprises one or more non-zero values; and an attitude controller configured to control the airframe attitude of an airframe of the aircraft to cause the airframe attitude to be the target airframe attitude calculated by the attitude calculator, and select a flight route that aligns with the target airframe attitude to be calculated by the attitude calculator to minimize a risk of lightning strikes on the aircraft.

5. An aircraft comprising:
a fuselage;
a main wing attached to the fuselage and configured to generate lift that acts on the aircraft;
electric field sensors configured to detect electric field intensities at a plurality of positions of the aircraft; and
circuitry configured to:
based on information on relationships between directions of electric fields around the aircraft and electric field intensity distributions on the aircraft, estimate a direction of an electric field around the aircraft from the detected electric field intensities at the plurality of positions of the aircraft;

calculate a target airframe attitude to control an airframe attitude of the aircraft so that the electric field intensity distribution on the aircraft becomes uniform relative to the direction of the electric field, in which the electric filed intensity distribution comprises one or more non-zero values; and control the airframe attitude of the aircraft to cause the airframe attitude to be the calculated target airframe attitude, and select a flight route that aligns with the target airframe attitude to be calculated by the attitude calculator to minimize a risk of lightning strikes on the aircraft.

6. A flight controller for an aircraft, the flight controller comprising circuitry configured to:

receive electric field intensities at a plurality of positions of the aircraft to estimate a direction of an electric field around the aircraft based on information on relationships between directions of electric fields around the aircraft and electric field intensity distributions on the aircraft;

calculate a target airframe attitude to control an airframe attitude of the aircraft so that the electric field intensity distribution on the aircraft becomes uniform relative to the direction of the electric field, in which the electric field intensity distribution comprises one or more non-zero values; and control the airframe attitude of the aircraft to cause the airframe attitude to be the calculated target airframe attitude, and select a flight route that aligns with the target airframe attitude to be calculated by the attitude calculator to minimize a risk of lightning strikes on the aircraft.

7. The aircraft according to claim 1, further comprising a vertical tail,
wherein the attitude calculator is configured to calculate, as the target airframe attitude, the airframe attitude in which a plane intersects perpendicularly with the direction of the electric field, the plane i) including a line that connects a vertical upper part of a cockpit of the aircraft and a vertical upper part of the vertical tail and ii) being parallel to a line that connects a right end of the main wing and a left end of the main wing.

8. The aircraft according to claim 1, wherein the attitude calculator is configured to calculate, as the target airframe attitude, the airframe attitude in which a line intersects perpendicularly with the direction of the electric field when viewed from a direction parallel to a roll axis of the aircraft, the line connecting a right end of the main wing and a left end of the main wing.

9. The aircraft according to claim 1, further comprising a vertical tail, wherein the attitude calculator is configured to calculate, as the target airframe attitude, the airframe attitude in which a line intersects perpendicularly with the direction of the electric field when viewed from a direction parallel to a pitch axis of the aircraft, the line connecting a vertical upper part of a cockpit of the aircraft and a vertical upper part of the vertical tail.

10. The aircraft according to claim 1, wherein the attitude calculator is configured to calculate, as the target airframe attitude, the airframe attitude in which an electric field intensity at a right end of the main wing and an electric field intensity at a left end of the main wing are equal.

11. The aircraft according to claim 1, wherein the attitude calculator is configured to calculate, as the target airframe attitude, the airframe attitude in which a deviation between an electric field intensity at a right end of the main wing and an electric field intensity at a left end of the main wing is within a predetermined range.

* * * * *